United States Patent
Chen et al.

(10) Patent No.: US 11,056,352 B2
(45) Date of Patent: Jul. 6, 2021

(54) MAGNETIC SLURRY FOR HIGHLY EFFICIENT CMP

(71) Applicant: Taiwan Semiconductor Manufacturing Company, Ltd., Hsinchu (TW)

(72) Inventors: Yen-Ting Chen, Taichung (TW); Chun-Hao Kung, Hsinchu (TW); Tung-Kai Chen, New Taipei (TW); Hui-Chi Huang, Zhubei (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/207,802

(22) Filed: Dec. 3, 2018

(65) Prior Publication Data
US 2020/0043747 A1    Feb. 6, 2020

Related U.S. Application Data

(60) Provisional application No. 62/712,654, filed on Jul. 31, 2018.

(51) Int. Cl.
*H01L 21/321* (2006.01)
*C09K 3/14* (2006.01)
*B24B 57/02* (2006.01)
*B24B 37/04* (2012.01)
*B01F 13/08* (2006.01)

(52) U.S. Cl.
CPC ...... *H01L 21/3212* (2013.01); *B01F 13/0818* (2013.01); *B24B 37/04* (2013.01); *B24B 57/02* (2013.01); *C09K 3/1427* (2013.01)

(58) Field of Classification Search
None
See application file for complete search history.

(56) References Cited

U.S. PATENT DOCUMENTS

| | | | | |
|---|---|---|---|---|
| 6,146,245 | A * | 11/2000 | Kremen | B24B 1/005 451/165 |
| 6,238,279 | B1 * | 5/2001 | Shau | B01D 35/06 451/446 |
| 6,863,771 | B2 * | 3/2005 | Brown | B24B 1/005 156/345.14 |
| 9,987,720 | B2 * | 6/2018 | Suen | B24B 37/20 |
| 10,293,454 | B2 * | 5/2019 | Nakayama | B24B 37/005 |
| 2003/0019577 | A1 * | 1/2003 | Brown | B24B 37/30 156/345.14 |
| 2006/0118760 | A1 * | 6/2006 | Yang | C23F 3/03 252/79.1 |
| 2009/0258574 | A1 * | 10/2009 | Yilmaz | B24B 45/003 451/28 |
| 2015/0000056 | A1 * | 1/2015 | Togawa | H01L 21/67046 15/102 |

(Continued)

Primary Examiner — Sylvia MacArthur
(74) Attorney, Agent, or Firm — Slater Matsil, LLP

(57) ABSTRACT

A chemical-mechanical polishing (CMP) system includes a head, a polishing pad, and a magnetic system. The slurry used in the CMP process contains magnetizable abrasives. Application and control of a magnetic field, by the magnetic system, allows precise control over how the magnetizable abrasives in the slurry may be drawn toward the wafer or toward the polishing pad.

20 Claims, 18 Drawing Sheets

(56) References Cited

U.S. PATENT DOCUMENTS

| | | | | |
|---|---|---|---|---|
| 2015/0255103 A1* | 9/2015 | Ueda | ............... | G11B 5/7315 |
| | | | | 428/836 |
| 2019/0270922 A1* | 9/2019 | Adefris | ............ | B24D 3/346 |
| 2020/0043747 A1* | 2/2020 | Chen | ............ | C09G 1/02 |

* cited by examiner

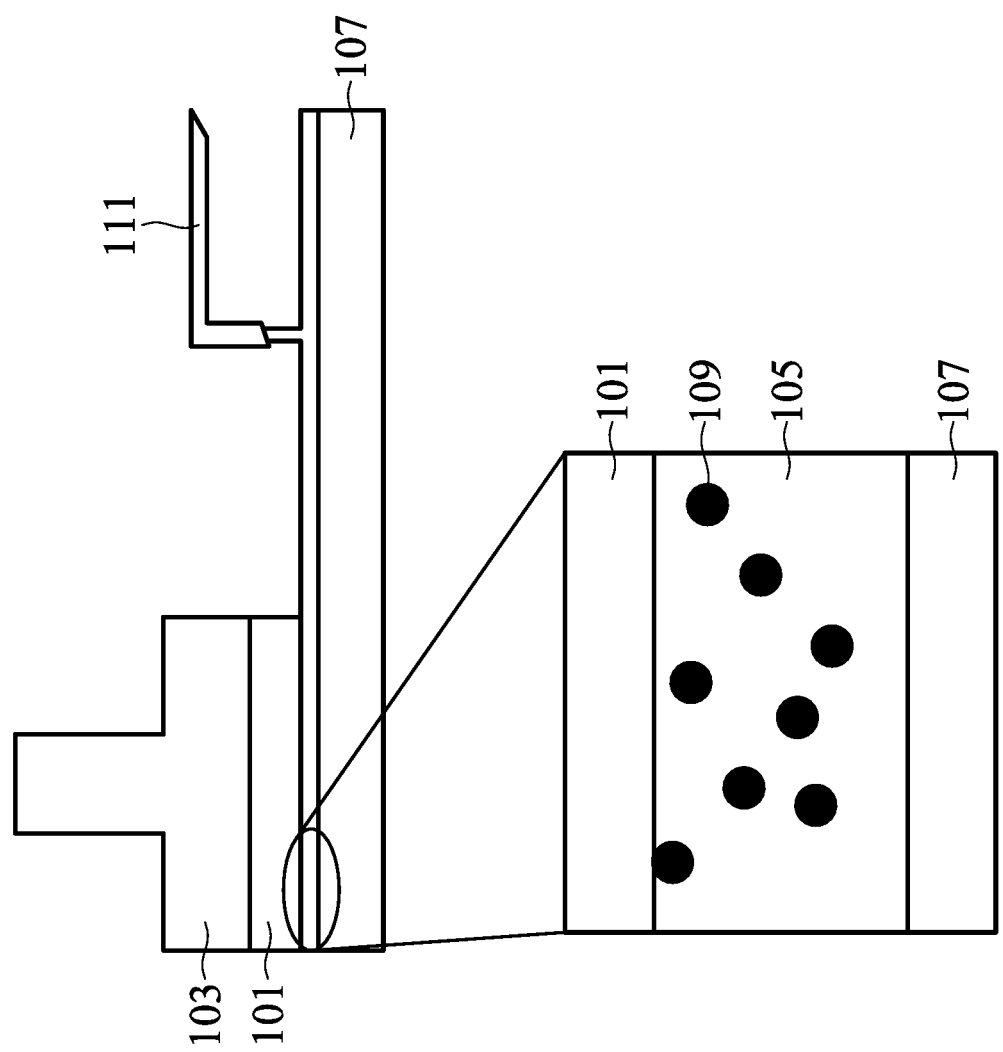

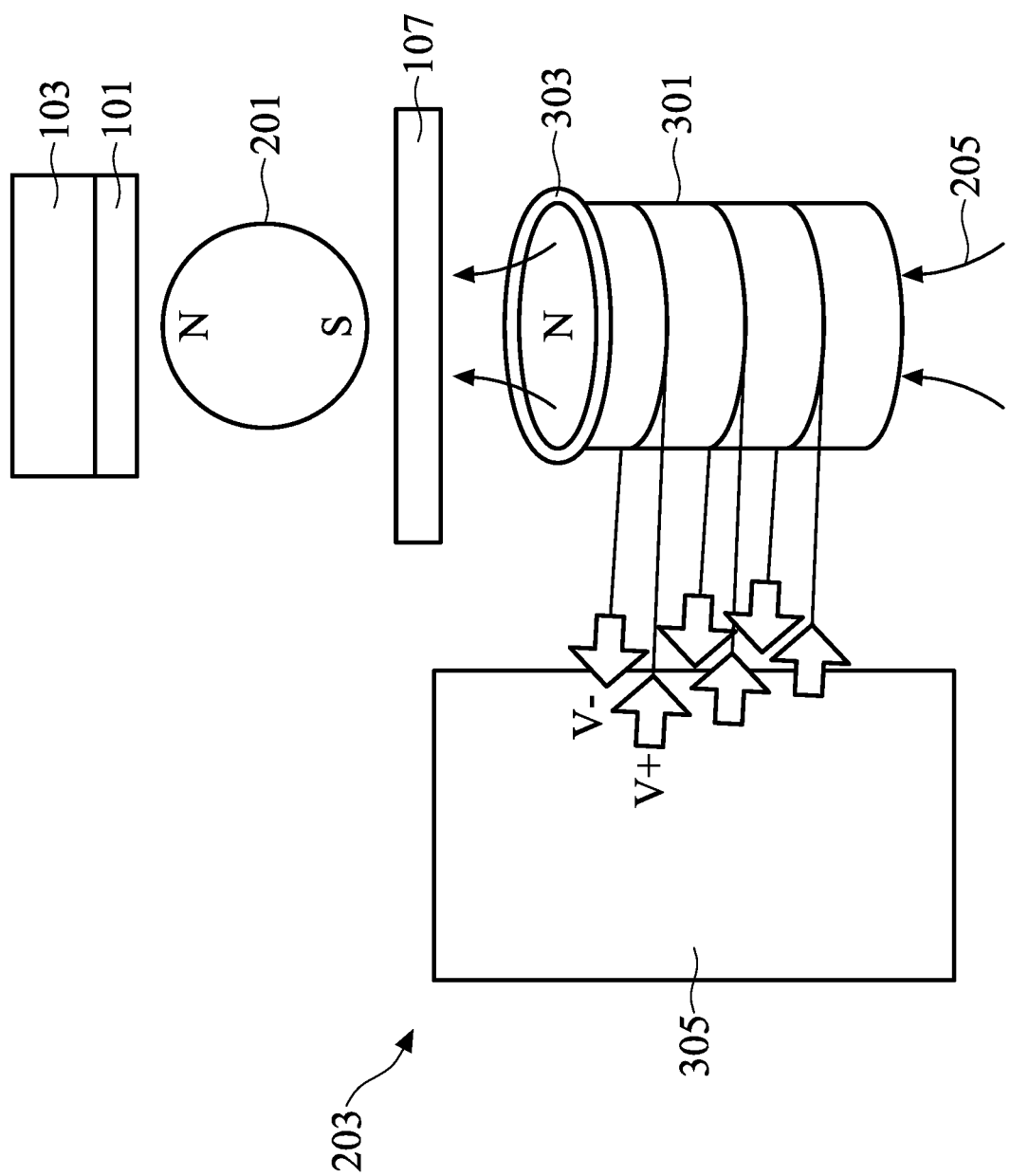

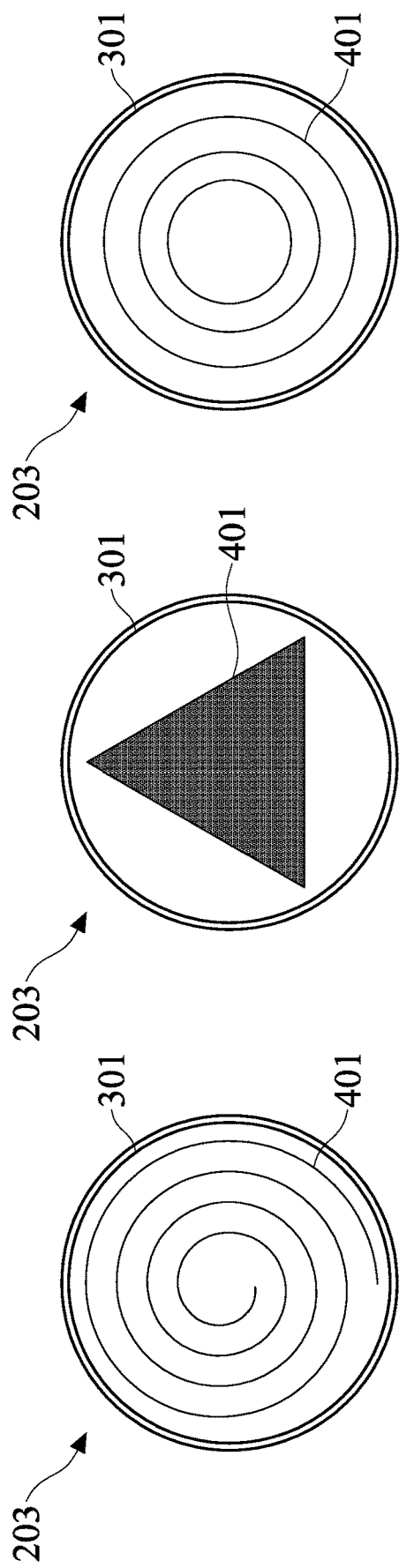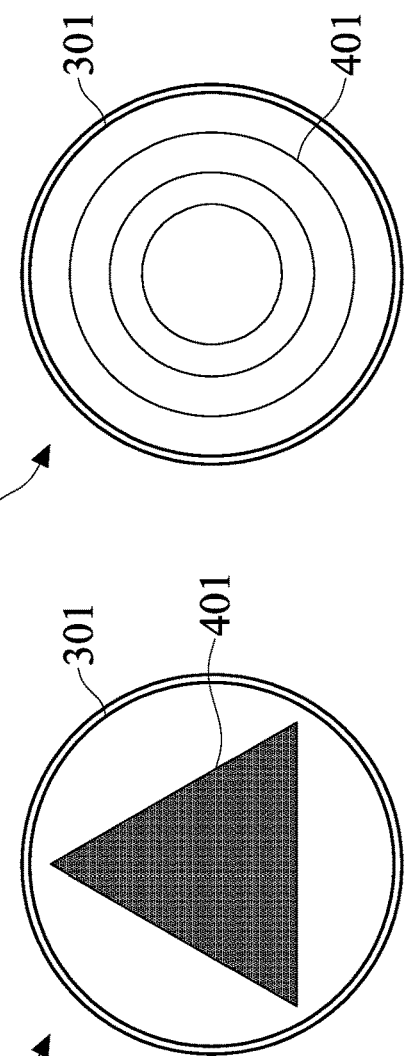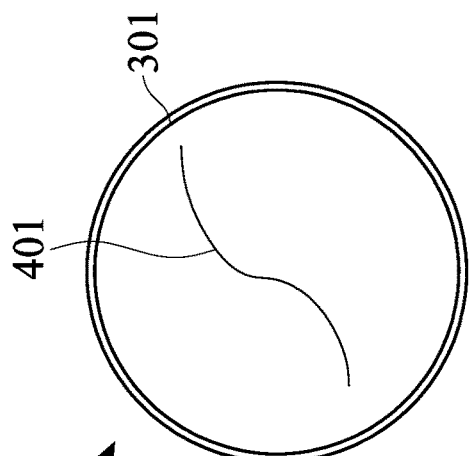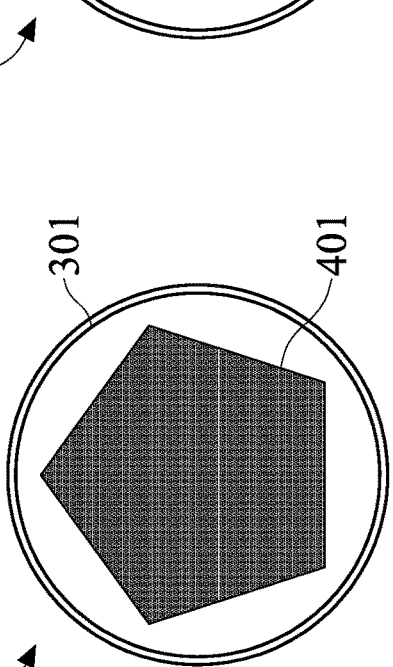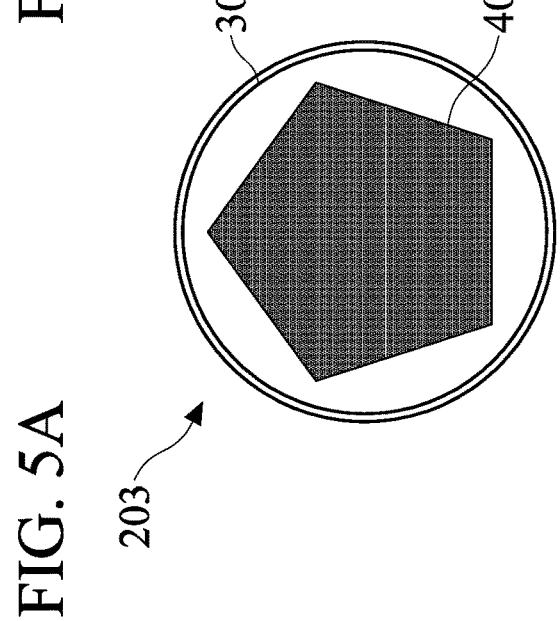

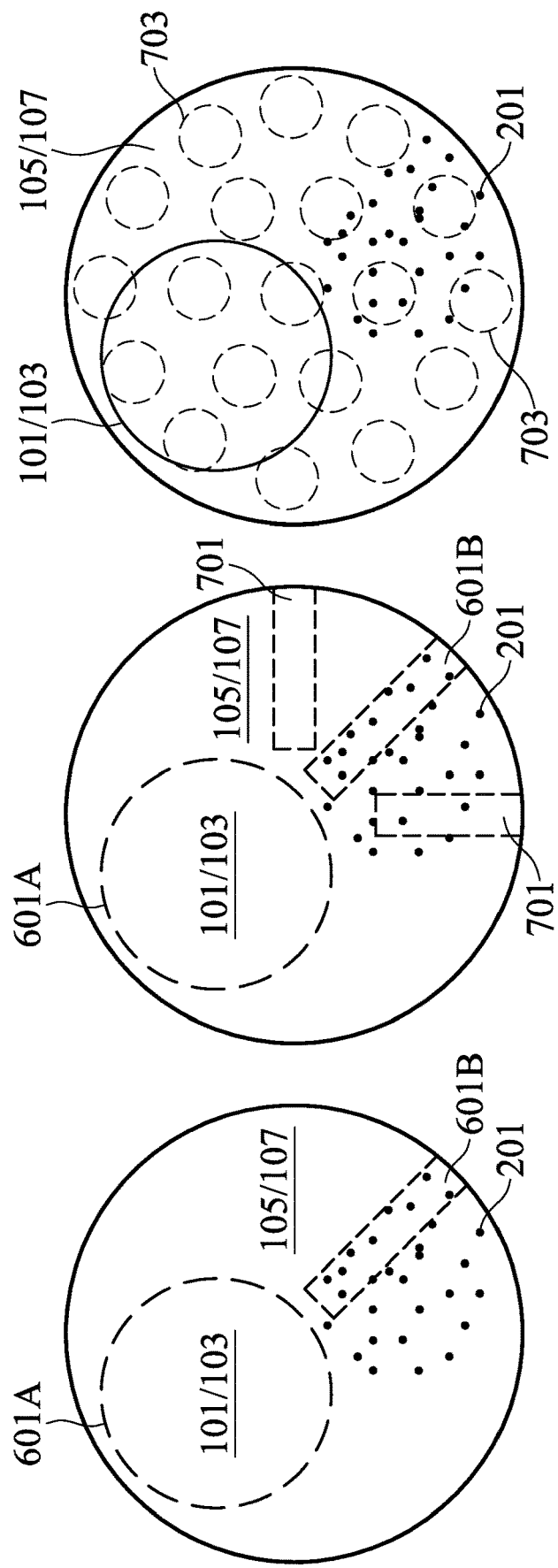

MAGNETIC SLURRY FOR HIGHLY EFFICIENT CMP

PRIORITY CLAIM AND CROSS-REFERENCE

This application claims benefit of U.S. Provisional Application Ser. No. 62/712,654, filed on Jul. 31, 2018, entitled "Magnetic Slurry For Highly Efficient CMP," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Chemical-mechanical polishing (CMP), or chemical-mechanical planarization, has become an important semiconductor manufacturing process since its introduction in the 1980s. An example application of the CMP process is the formation of copper interconnect using the damascene/dual-damascene process, where the CMP process is used to remove metal (e.g., copper) deposited outside trenches formed in a dielectric material. The CMP process is also widely used to form a planar device surface at various stages of semiconductor manufacturing because the photolithography and etching processes used to pattern the semiconductor devices may need a planar surface to achieve the targeted accuracy. As the semiconductor manufacturing technology continues to advance, better CMP tools are needed to meet the more stringent requirements of advanced semiconductor processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a schematic view of a chemical-mechanical polishing system.

FIGS. 3A-3D illustrate the effects of a chemical-mechanical polishing system comprising a first magnetic system on magnetizable abrasives.

FIGS. 5A-5E are top-down schematic views of various shapes for a permanent magnet.

FIGS. 7A-7C are top-down schematic views of chemical-mechanical polishing systems comprising a first magnetic system and a second magnetic system.

DETAILED DESCRIPTION

Figure 2A:
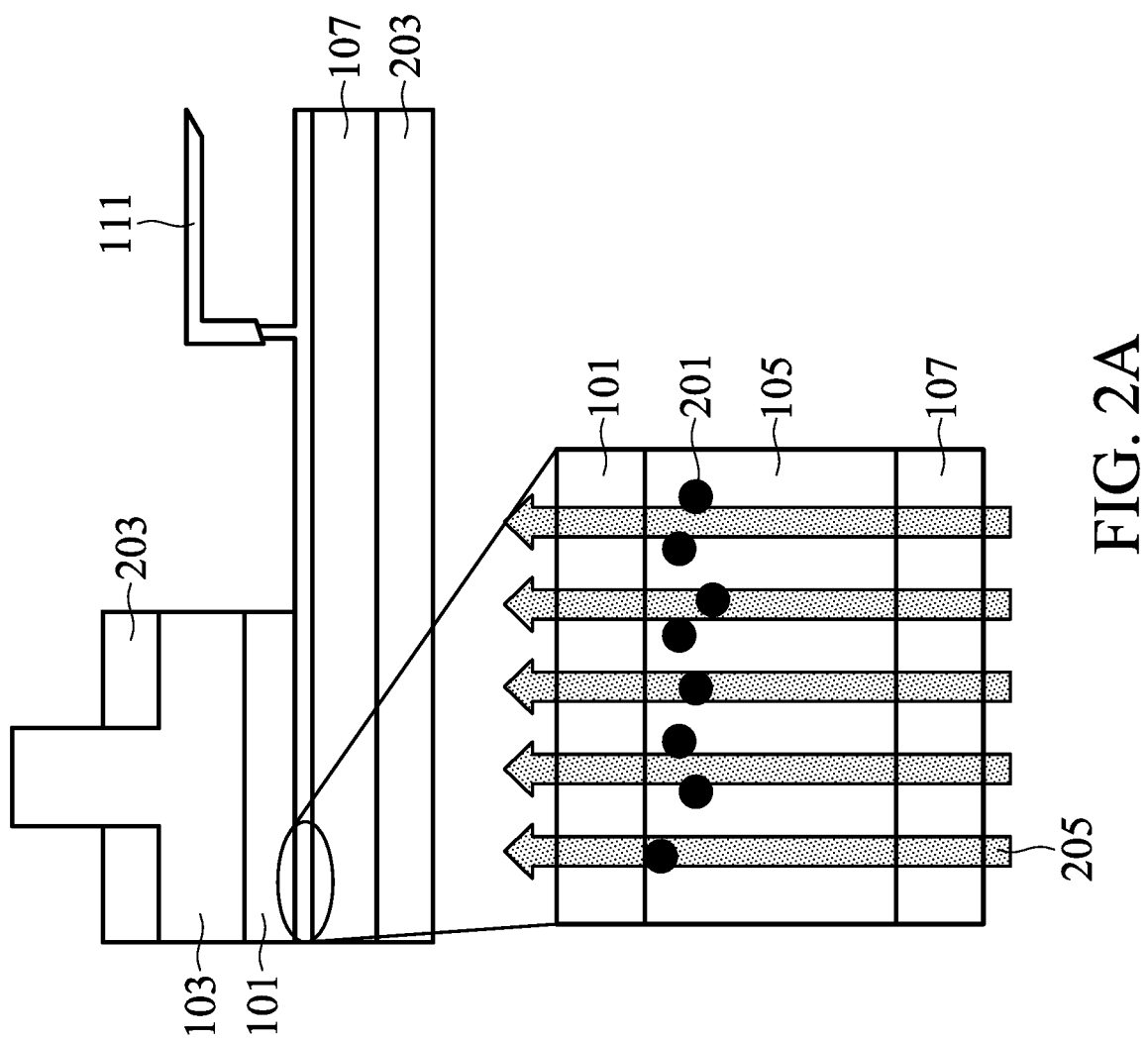
FIGS. 2A-2B are schematic views of chemical-mechanical polishing systems comprising a first magnetic system.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout the manufacture of a semiconductor device, the semiconductor wafer undergoes a large number of process steps. One of the most frequent steps involves undergoing chemical-mechanical polishing (CMP). The CMP step is intended to smooth the surface of, or planarize, the wafer before, in between, and after various other steps in the manufacturing process.

Typically, during the CMP step, the surface of the wafer to be smoothed is held face down against a broad surface of a polishing pad. The wafer and/or the polishing pad will rotate. If both rotate, then they may rotate in the same or opposite directions. Between the wafer and polishing pad is a corrosive chemical slurry which acts as an abrasive to aid in polishing the surface of the wafer. The slurry usually includes a liquid with solid abrasives suspended in the liquid.

Due to the frequency of the CMP steps in semiconductor manufacturing, improving the polishing and the removal rate of surface imperfections can have a significant impact on the entire manufacturing process. The additional benefits of an improved CMP step may include: better planarization, improved thickness uniformity, decreased under-polishing, and higher polishing removal rate.

Heavy abrasives made of silica ($SiO_2$), comprising about 1% or greater of the solid content in the slurry composition, have become a popular way to improve CMP effectiveness. However, the side effects of silica abrasives may include:

over-polishing, scratches, abrasive aggregation, and difficulty controlling slurry dispersion uniformity on the polishing pad and wafer.

Embodiments disclosed herein include magnetic, or magnetizable, abrasives to compose part of what is called a "magnetic slurry." When a magnetic field is applied by the CMP system, the operators can control the magnetizable abrasive distribution in the slurry. For example, during polishing, the magnetic field may distribute the magnetizable abrasives toward the wafer surface, thereby increasing polishing speed and improving uniformity while decreasing the slurry usage. In addition, after polishing, the magnetic field may be removed to let the magnetizable abrasives move away from the wafer, or the magnetic field may be reversed to cause or allow the magnetizable abrasives to distribute away from the wafer and toward the polishing pad, thereby facilitating the cleaning step, such as increasing cleaning speed and efficiency. Indeed, effective use of the magnetic field upon the magnetizable abrasives will improve the CMP step, improve cleaning, and increase longevity of the polishing pad in some embodiments.

Referring to Table 1 below, the magnetizable abrasives may be selected from solid materials that exhibit an absolute magnetic susceptibility greater than or substantially equal to about $5 \times 10^{-6}$ cm$^3$/mol. The magnetic susceptibility of a material indicates whether the material is attracted to or repelled by a magnetic field. A magnetic susceptibility greater than zero indicates that the material is paramagnetic and, therefore, attracted to a magnetic field. A magnetic susceptibility of less than zero indicates that the material is diamagnetic and, therefore, repelled by a magnetic field. In addition, the magnetic susceptibility relates to the degree of magnetization of the material, or propensity to become magnetized, in response to the magnetic field. That is, a higher magnetic susceptibility indicates a more effective response to the magnetic field.

TABLE 1

Absolute value of magnetic susceptibility of paramagnetic and diamagnetic materials.

| Magnetizable Abrasive | \|Magnetic susceptibility\| (cm$^3$/mol) |
|---|---|
| Paramagnetic materials | |
| Titanium(III) oxide (Ti$_2$O$_3$) | $132 \times 10^{-6}$ |
| Cerium(IV) oxide (CeO$_2$) | $26.0 \times 10^{-6}$ |
| Titanium dioxide (TiO$_2$) | $5.9 \times 10^{-6}$ |
| Diamagnetic materials | |
| Zirconium dioxide (ZrO$_2$) | $13.8 \times 10^{-6}$ |
| Aluminum oxide (Al$_2$O$_3$) | $37.0 \times 10^{-6}$ |
| Silicon dioxide (SiO$_2$) | $29.6 \times 10^{-6}$ |

As shown in Table 1, certain exemplary materials may contain either paramagnetic or diamagnetic properties under a magnetic field. The effective application of the magnetic field will depend on the type of abrasives chosen. And vice versa, the chosen abrasives will depend on the specifications of the magnetic field that may be applied by the CMP system. For example, titanium(III) oxide (Ti$_2$O$_3$), cerium (IV) oxide (CeO$_2$), and titanium dioxide (TiO$_2$) are paramagnetic materials each exhibiting paramagnetism greater than about $5 \times 10^{-6}$ cm$^3$/mol. In addition, zirconium dioxide (ZrO$_2$), aluminum oxide (Al$_2$O$_3$), and silicon dioxide (SiO$_2$) each exhibit diamagnetism greater than $5 \times 10^{-6}$ cm$^3$/mol, or a magnetic susceptibility of less than about $-5 \times 10^{-6}$ cm$^3$/mol. In an embodiment, the magnetizable abrasives will be composed of iron and be complemented by other abrasives composed of cobalt and nickel. In addition, the magnetizable abrasives may further comprise one or more of the magnetizable abrasives listed in Table 1. The magnetizable abrasives may constitute about 0.05% to about 10% by mass of the overall abrasives composition. For the sake of simplicity, it will generally be assumed that paramagnetic materials are used for the magnetizable abrasives in the discussion below. It should be noted that diamagnetic abrasives will generally have an opposite to an applied magnetic field. Note that diamagnetic abrasives technically are not magnetizable because they are repelled by a magnetic field, however, for simplicity, this disclosure will use the term "magnetizable abrasives" to refer to paramagnetic abrasives, diamagnetic abrasives, or a combination of both.

Further, the size of the magnetizable abrasives will affect how they physically respond to the magnetic field. In other words, the size is related to their mass and volume, which affect how easily they are moved by an applied magnetic field. In general, each magnetizable abrasive may have a diameter between about 1 nm to about 1000 nm, or may be about 30 nm, 50 nm, or 100 nm. Indeed, magnetizable abrasives with a smaller diameter may be lighter and, thus, more sensitive and/or more easily manipulated by a magnetic field, which provides greater control before, during, and after the polishing.

Referring to FIG. 1, in a typical CMP system, a head 103 holds a wafer 101 such that the surface of the wafer to be polished is pressed against a slurry 105 disposed over a polishing pad 107. The slurry 105 may comprise water, abrasives, chelator, inhibitor, pH adjuster, or any combination thereof. The chelator may comprise one or more of molybdate, glutamic acid, diphosphine, and/or the like. The inhibitor may comprise one or more of phosphate, nitrate, carboxylic acid, and/or the like. The wafer 101 may not make direct contact with the polishing pad 107 itself with the slurry 105 interposed therebetween. As shown, abrasives 109 are usually distributed throughout the slurry 105, wherein the operator has little to no control of whether the abrasives 109 are distributed closer to the wafer 101, closer to the polishing pad 107, or evenly throughout the slurry 105. As such, the abrasives 109 tend to have a random distribution throughout the slurry 105. Any abrasives 109 located closer to the polishing pad 107 and away from the wafer 101 have little to no effect on the polishing of the wafer 101.

In addition, a dispenser 111 may dispense the slurry 105 onto the polishing pad 107 before the polishing and/or throughout the polishing. The slurry 105 is typically dispensed on a portion of the polishing pad 107 away from where the wafer 101 makes contact with the slurry 105.

Figure 2B:
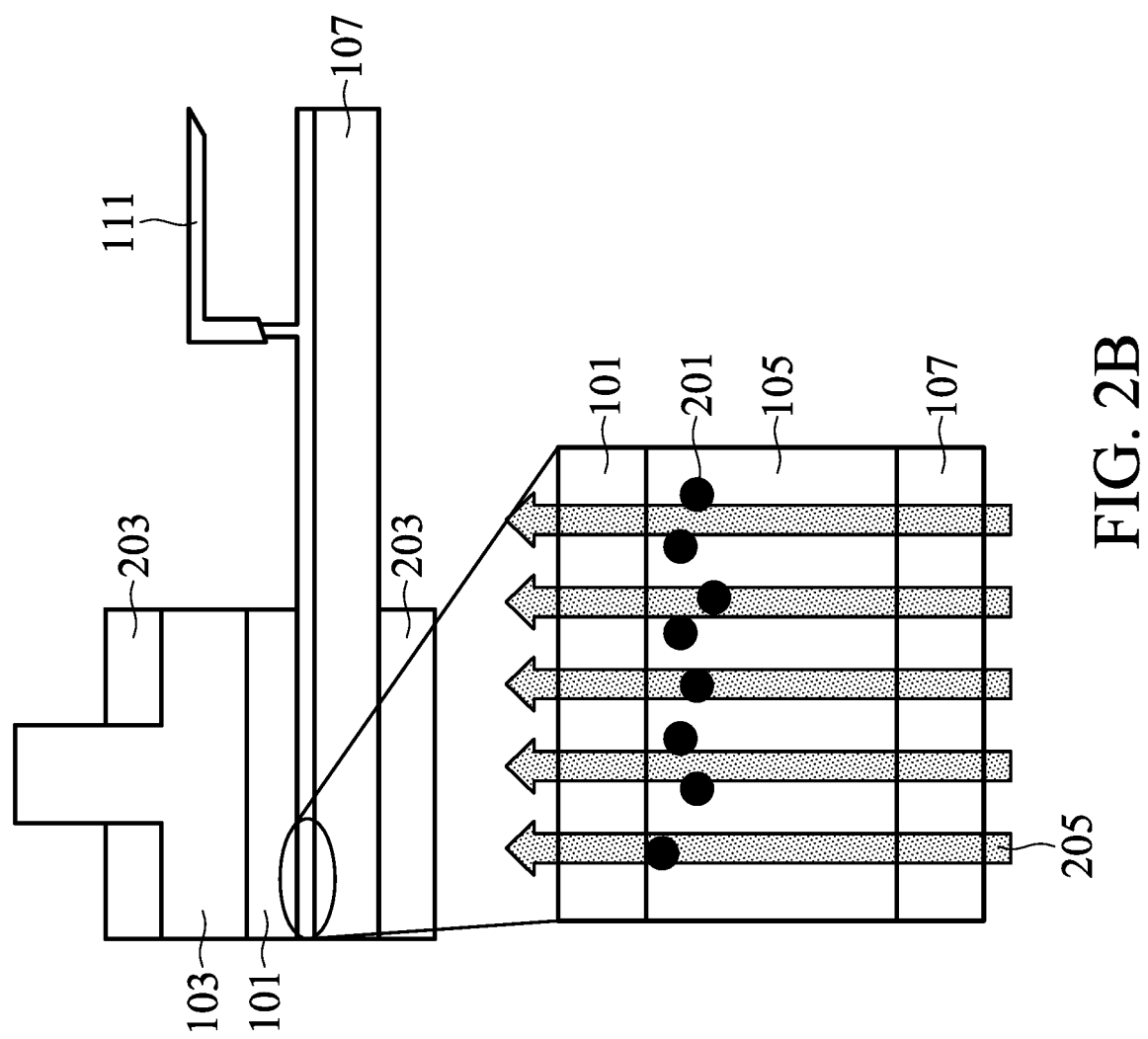

Referring to FIGS. 2A-2B, in an embodiment, in a slurry containing magnetizable abrasives 201, a magnetic system 203 may apply a magnetic field 205 to push the magnetizable abrasives 201 within the slurry 105 closer to the wafer 101. The strength of the magnetic field 205 may be controlled in order to increase or decrease the force at which the magnetizable abrasives 201 are pushed toward the wafer 101. As depicted in FIG. 2A, the magnetic system 203 (or a magnet included in the magnetic system 203) may extend across the entire diameter of the polishing pad 107. However, the magnetic system 203 may be any other size, such as smaller or larger in diameter, and the magnet or resulting magnetic field 205 may be aligned with the wafer 101 (as depicted in FIG. 2B) as opposed to the polishing pad 107. Further, as shown in FIGS. 2A-2B, the magnetic system 203, or a portion thereof (e.g., the magnet(s)), may be located above the wafer 101 in order to adjust the orientation (i.e., direction) of the magnetic field 205. Discussed in more detail below, the magnetic system 203 and other magnetic systems described here or elsewhere in this disclosure will generally use one or more electromagnets, one or more permanent magnets, or both. In application, permanent magnets may be moved closer to or farther from the wafer 101 or the polishing pad 107 in order to effect, alter, or remove a magnetic field 205 acting on the magnetizable abrasives 201.

Figure 3B:
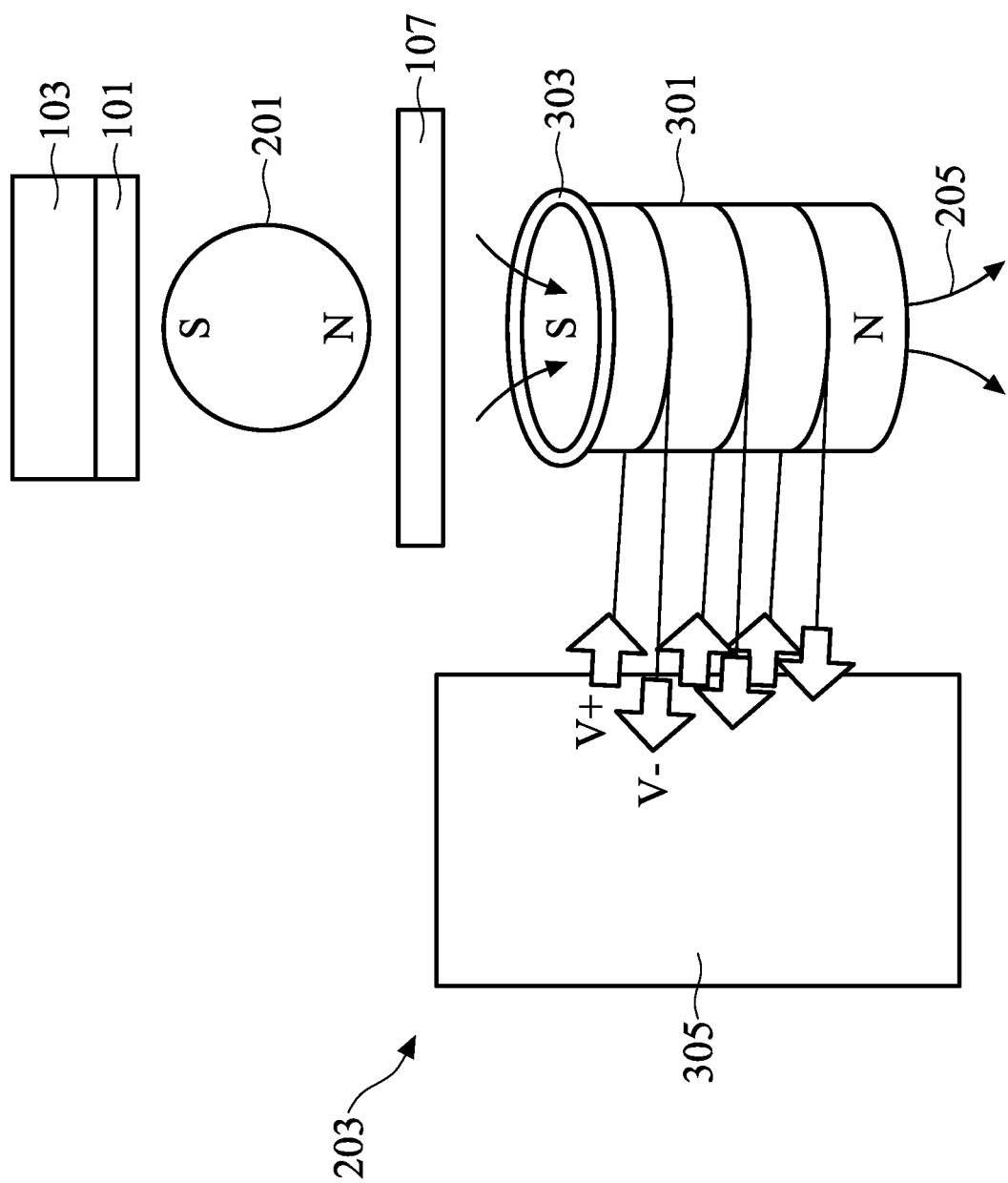
Figure 3C:
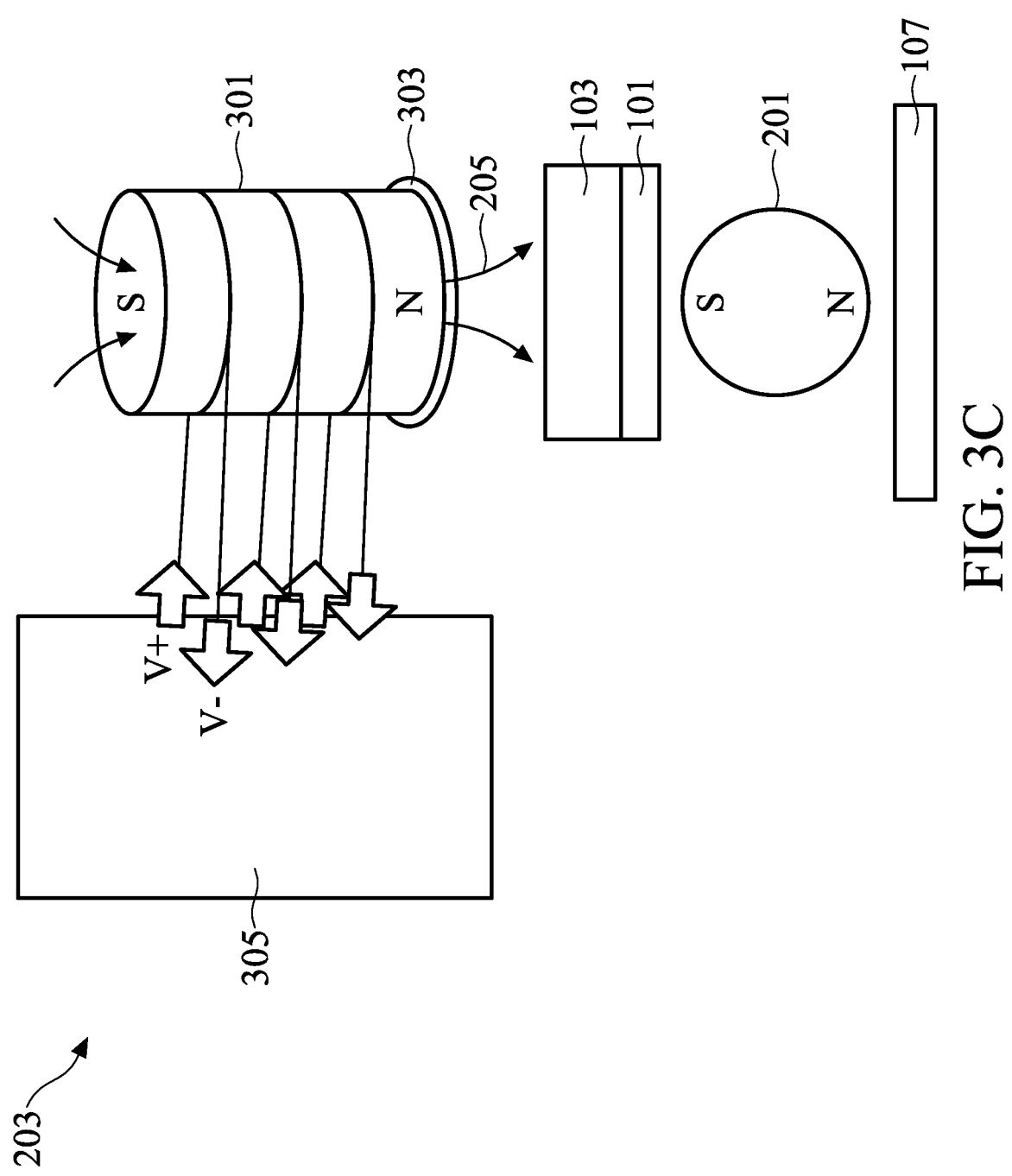

Referring to FIGS. 3A-3C, the magnetic field 205 may be applied wherein the magnetic system 203 includes an electromagnet 301 and/or a permanent magnet 303 located below the polishing pad 107 or above the wafer 101. FIGS. 3A-3B illustrate the electromagnet 301 and the permanent magnet 303 located below the polishing pad 107, producing a magnetic field 205 that forces paramagnetic magnetizable abrasives 201 toward the polishing pad 107. In fact, regardless of whether the high voltage (e.g., 11 kV) current 305 of the electromagnet 301 flows counter-clockwise causing the magnetic field 205 to point upward (e.g., FIG. 3A) or clockwise causing the magnetic field 205 to point downward (e.g., FIG. 3B), paramagnetic magnetizable abrasives 201 will align to the magnetic field 205 and will be pulled toward the polishing pad 107. The high voltage current 305 may supply either a direct current (DC) or an alternating current (AC), but preferably DC to create a stronger field. The permanent magnet 303 may be used instead of the electromagnet 301 or in addition to it for greater control of the magnetizable abrasives 201. As shown, the magnetizable abrasives 201 will orient themselves to align with and be attracted to the source of the magnetic field 205. Alternatively, if diamagnetic abrasives 201 are used, they will be pushed upward away from the magnetic field 205 and toward the wafer 101. As shown in FIG. 3C, applying the magnetic field 205 by a portion of the magnetic system 203 located above the wafer 101 will have an opposite effect on the magnetizable abrasives 201. That is, the magnetizable abrasives will be attracted toward the wafer 101 as shown in FIG. 3C.

Figure 3D:
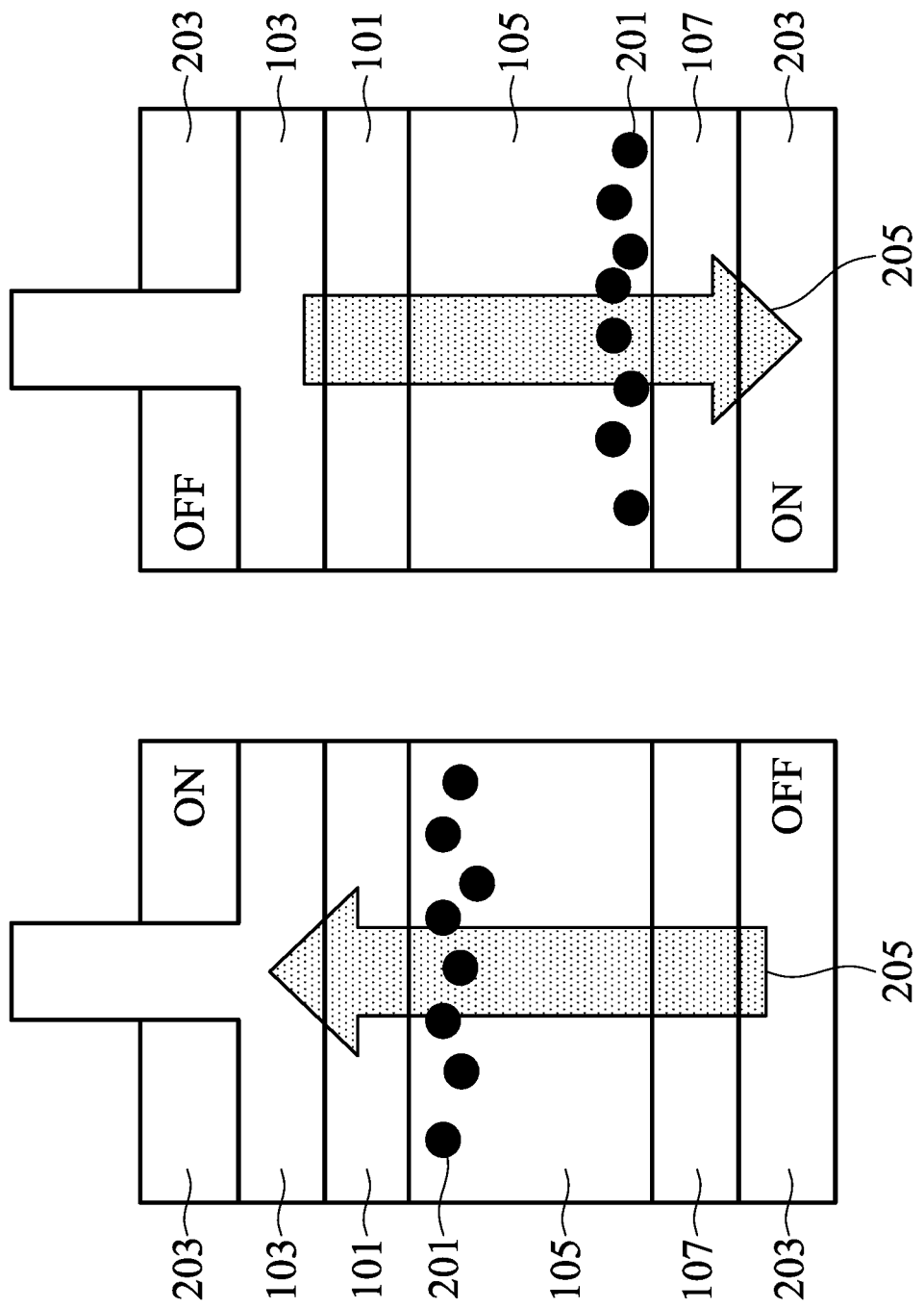

As shown in FIG. 3D, the portion of the magnetic system 203 above the wafer 101 may be applied or turned on to attract the magnetizable abrasives 201 toward the wafer 101 for improved polishing. Alternatively, the portion of the magnetic system 203 below the polishing pad 107 may be applied or turned on to attract the magnetizable abrasives 201 toward the polishing pad 107, for example, after the polishing. As discussed above, the portions of the magnetic system 203 above and below the wafer 101 and polishing pad 107, respectively, may each comprise an electromagnet 301 or a permanent magnet 303 or both.

Figure 4:
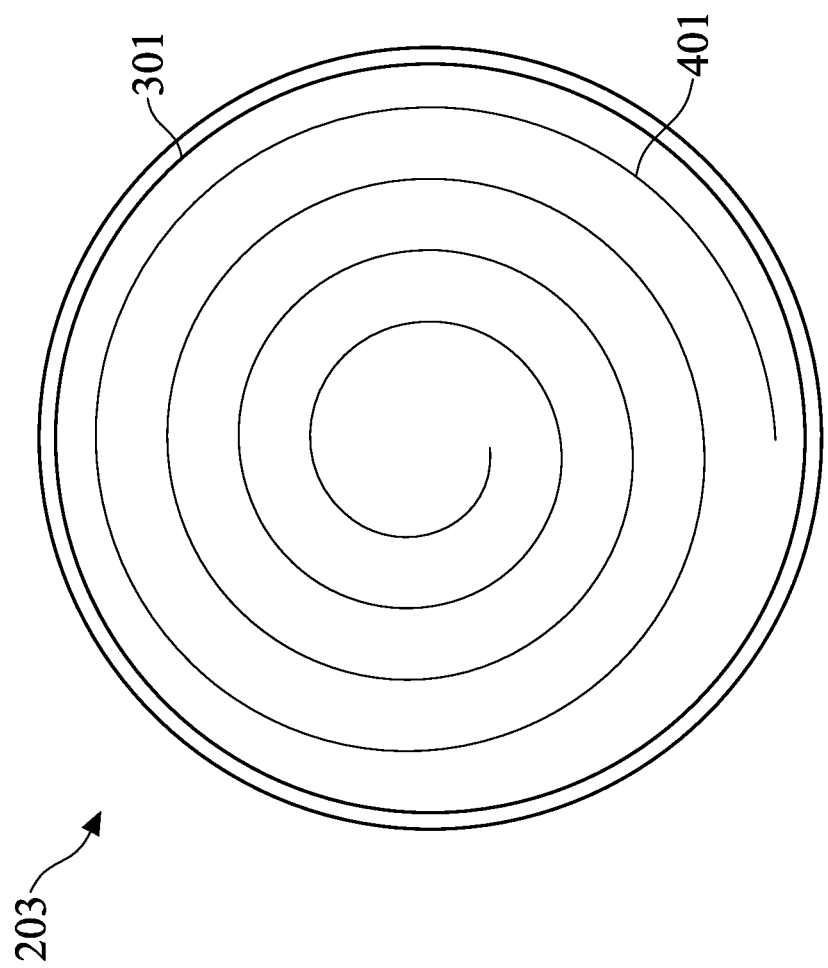
FIG. 4 is a top-down schematic view of a spiral permanent magnet that may be used in a chemical-mechanical polishing system comprising a first magnetic system.

Referring to FIG. 4, the magnetic system 203 may comprise an electromagnet 301 including a current-carrying coil and/or a permanent magnet 401. The permanent magnet 401 may be composed of neodymium, cobalt, nickel, or any combination thereof. Specifically, the permanent magnet 401 may comprise neodymium. The permanent magnet 401 may have a diameter of about 300 mm to about 320 mm for application on a typical 300 mm wafer, for example. In addition, the current-carrying coil of the electromagnet 301 may comprise iron and/or copper. The magnetic field 205 resulting from the permanent magnet 401 and/or the electromagnet 301 may have a strength of between about 0.5 Tesla and about 3.0 Tesla. As discussed above, typically the electromagnet 301 will produce a large magnetic field to attract the magnetizable abrasives 201 toward or away from the wafer 101, and the permanent magnet 401 will produce a smaller magnetic field for greater precision in positioning the magnetizable abrasives 201 in the slurry 105.

Referring to FIGS. 5A-5E, the permanent magnet may have one of many different shapes, such as a spiral, a triangle, concentric circles, a polygon, or a curved rod. In most cases, the spiral shape may be chosen to provide a powerful and uniform magnetic field 205 across the portion of the slurry 105 most affected by the magnetic field 205. The spiral shape provides enough disturbance of the magnetizable abrasives 201 to achieve a uniform polishing rate across the wafer 101, as the case may be. The permanent magnet 401 may be oriented such that its center is aligned with the center of the wafer 101 or, alternatively, with its center offset from the center of the wafer 101 by about 10 μm to about 10 mm. In addition, although the magnetic field 205 is depicted in the figures as having a generally upward or downward orientation, the magnetic field 205 (and any other magnetic fields discussed herein) may also have an angle from the vertical greater than 0 degrees and less than or substantially equal to 90 degrees, such as about 45 degrees. The magnetic system 203 may alter the strength and direction of the magnetic field 205, thereby providing precise control over the positions of the magnetizable abrasives 201 with respect to the wafer 101 and the polishing pad 107.

Figure 6:
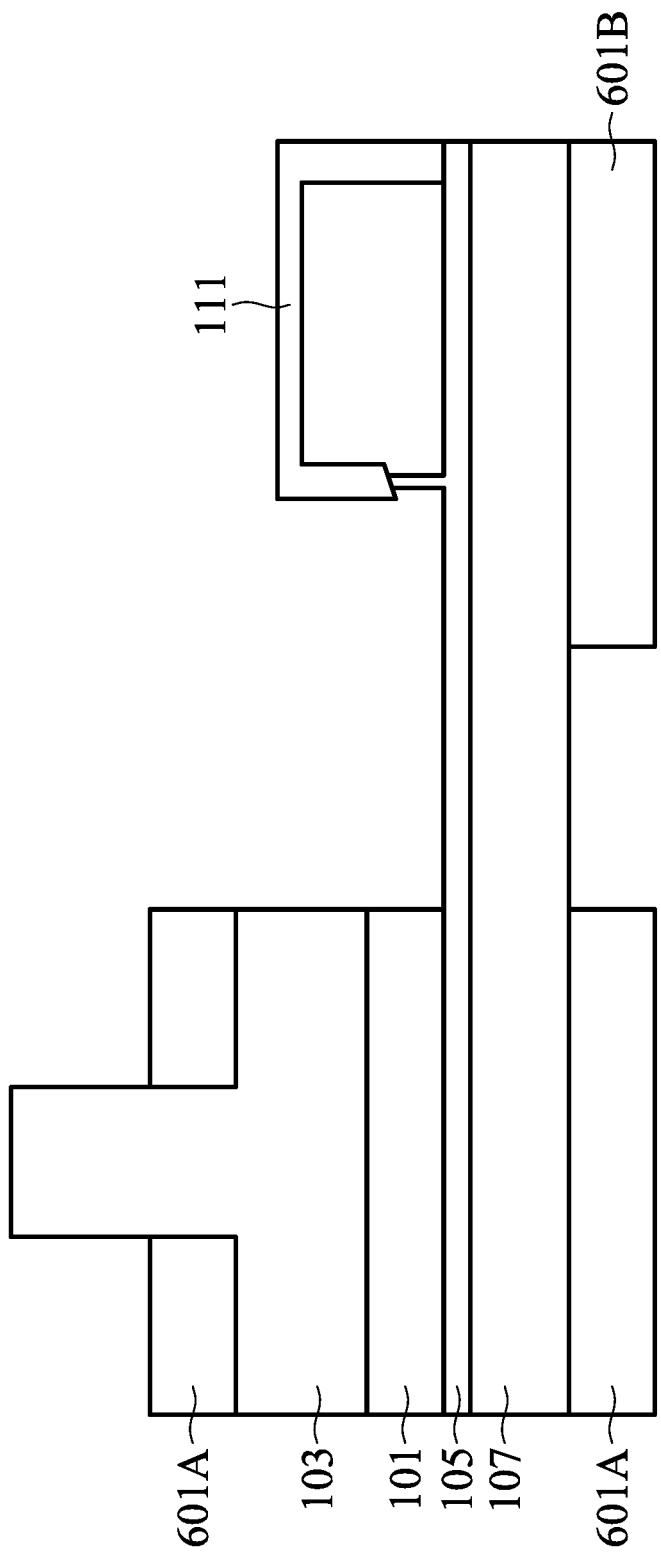
FIG. 6 is a schematic view of a chemical-mechanical polishing system comprising a first magnetic system and a second magnetic system.

Referring to FIG. 6, in another embodiment, the CMP system comprises a first magnetic system 601A, similar to the magnetic system 203 described above, and a second magnetic system 601B located below the polishing pad 107. Specifically, the second magnetic system 601B may be located laterally displaced from the wafer 101 and the first magnetic system 601A. As discussed above, the first magnetic system 601A may have a portion above the wafer 101 and head 103 or a portion below the polishing pad 107 or both. The second magnetic system 601B may be used to control the concentration of the magnetizable abrasives 201 in various portions of the slurry 105. For example, by attracting some of the magnetizable abrasives 201 toward the second magnetic system 601B, a fewer number of magnetizable abrasives 201 will be distributed in the portion of the slurry 105 that may be near and polishing the wafer 101 at that particular time. Similar to the first magnetic system 601A and the magnetic system 203, the second magnetic system 601B or a portion thereof (e.g., an electromagnet and/or a permanent magnet) may be located above the polishing pad 107. Each magnetic system may be independently controllable.

As shown in FIG. 7A, the second magnetic system 601B (depicted with a dashed line to indicate that it may be below the polishing pad 107) may draw some of the magnetizable abrasives 201 away from the portion of the slurry 105 near or at the wafer 101. In addition, as shown in FIG. 7B, the CMP system may comprise additional magnetic systems 701. For example, additional magnetic systems 701 may be located above or below the polishing pad 107 and laterally displaced from the wafer 101, the first magnetic system 601A, and the second magnetic system 601B. These additional magnetic systems may serve a similar purpose as the second magnetic system 601B, such as to reduce the concentration of magnetizable abrasives 201 near the wafer 101. In general, however, the additional magnetic systems in coordination with the first magnetic system 601A and the second magnetic system 601B provide greater control over the concentration of the magnetizable abrasives 201 throughout various portions of the slurry 105. Each magnetic system may be independently controllable.

Further, as shown in FIG. 7C, instead of the first magnetic system 601A and the second magnetic system 601B, the CMP system may comprise a plurality of magnetic systems 703 arranged in a pattern or an array. Each of the plurality of magnetic systems 703 may comprise an electromagnet and a permanent magnet as described with respect to magnetic systems in previous embodiments, or each of the plurality of magnetic systems 703 may share either of those components. The plurality of magnetic systems 703 may further share a voltage source with one another, however, they may be individually controllable to produce magnetic fields with varying strength and orientation across the plurality of magnetic systems 703. For example, the voltage difference and/or the current running through the respective coils may vary across the plurality of magnetic systems 703. Similar to other embodiments described herein, some of the plurality of magnetic systems 703 may be located above the wafer 101 and head 103 and some of the plurality of magnetic systems 703 may be located below the polishing pad 107. It can be appreciated that in regard to the plurality of magnetic systems 703 depicted in FIG. 7C, those directly above or below the wafer 101 may be controlled similarly to that described for a first magnetic system 601A, and those laterally displaced from the wafer 101 may be controlled similarly to that described for a second magnetic system 601B and any additional magnetic systems 701, as described in connection to the FIGS. 6, 7A, and 7B embodiments.

Figure 8A:
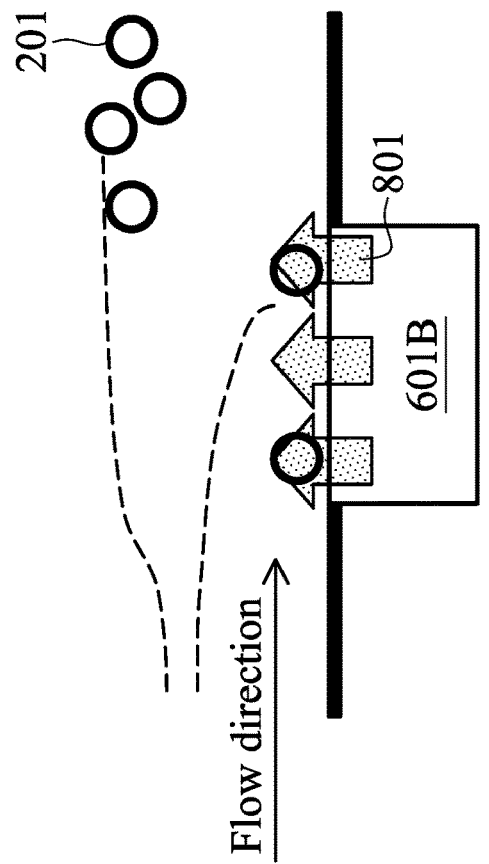
FIGS. 8A-8B illustrate the effect of a chemical-mechanical polishing system comprising a first magnetic system and a second magnetic system on magnetizable abrasives.
Figure 8B:
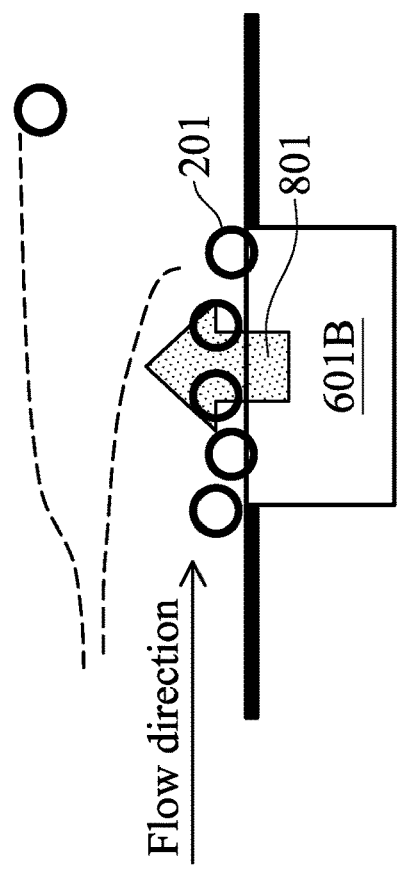

As depicted in FIG. 8A, when the second magnetic system 601B creates a relatively strong magnetic field 801, more magnetizable abrasives 201 are drawn toward the second magnetic system 601B and, therefore, a lower concentration of the magnetizable abrasives 201 continue in-cycle toward the wafer 101. Alternatively, as depicted in FIG. 8B, when the second magnetic system 601B creates a relatively weak magnetic field 801, fewer magnetizable abrasives 201 are drawn toward the second magnetic system 601B and, therefore, a higher concentration of magnetizable abrasives 201 continue in-cycle toward the wafer 101. Naturally, turning off the second magnetic system 601B would result in an even distribution of magnetizable abrasives 201 throughout the slurry 105, aside from the effects of the first magnetic system 601A and/or any other phenomena affecting the distribution of the magnetizable abrasives 201 during polishing or otherwise.

Figure 9A:
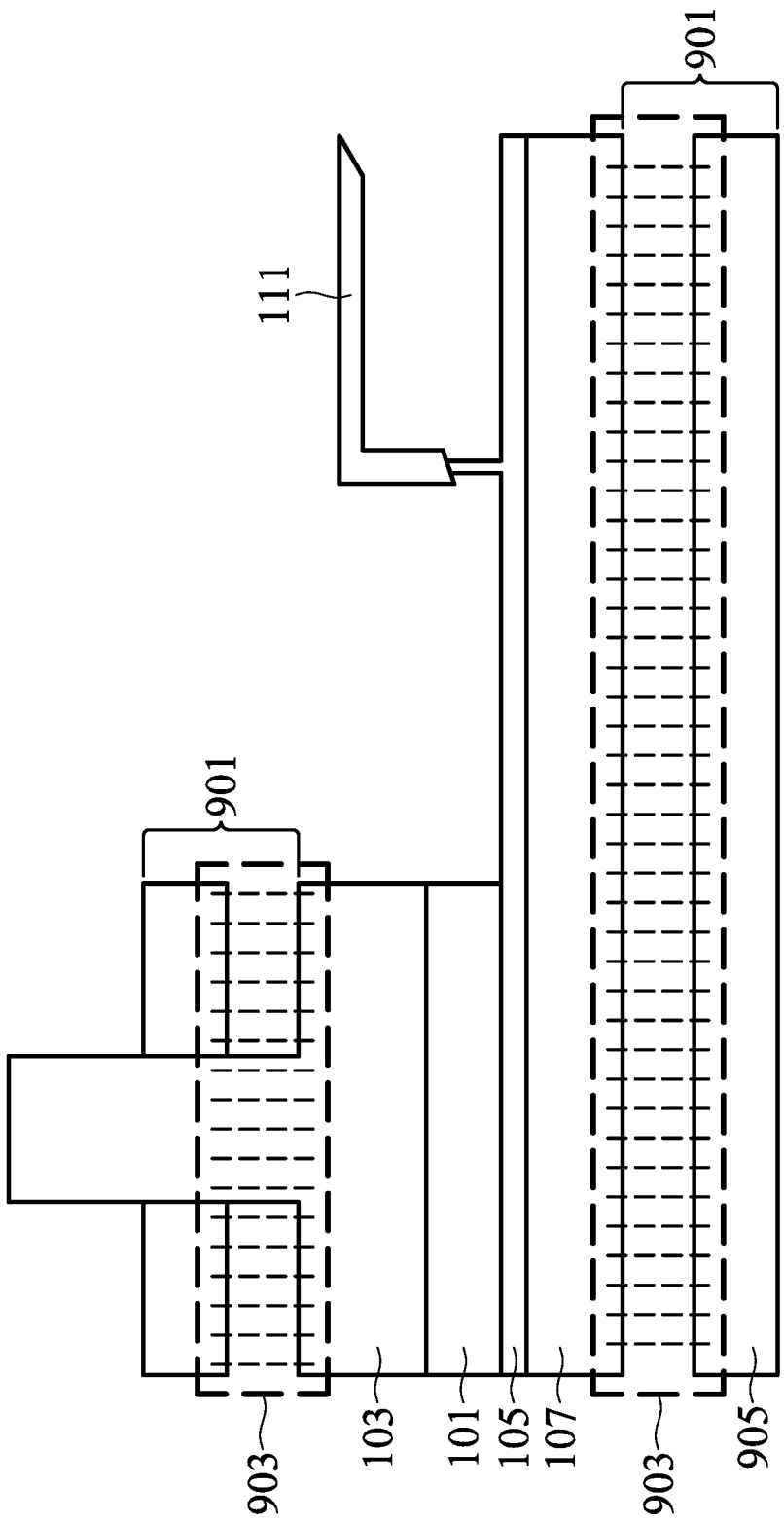
FIGS. 9A-9B are schematic views of chemical-mechanical polishing systems comprising a third magnetic system.
Figure 9B:
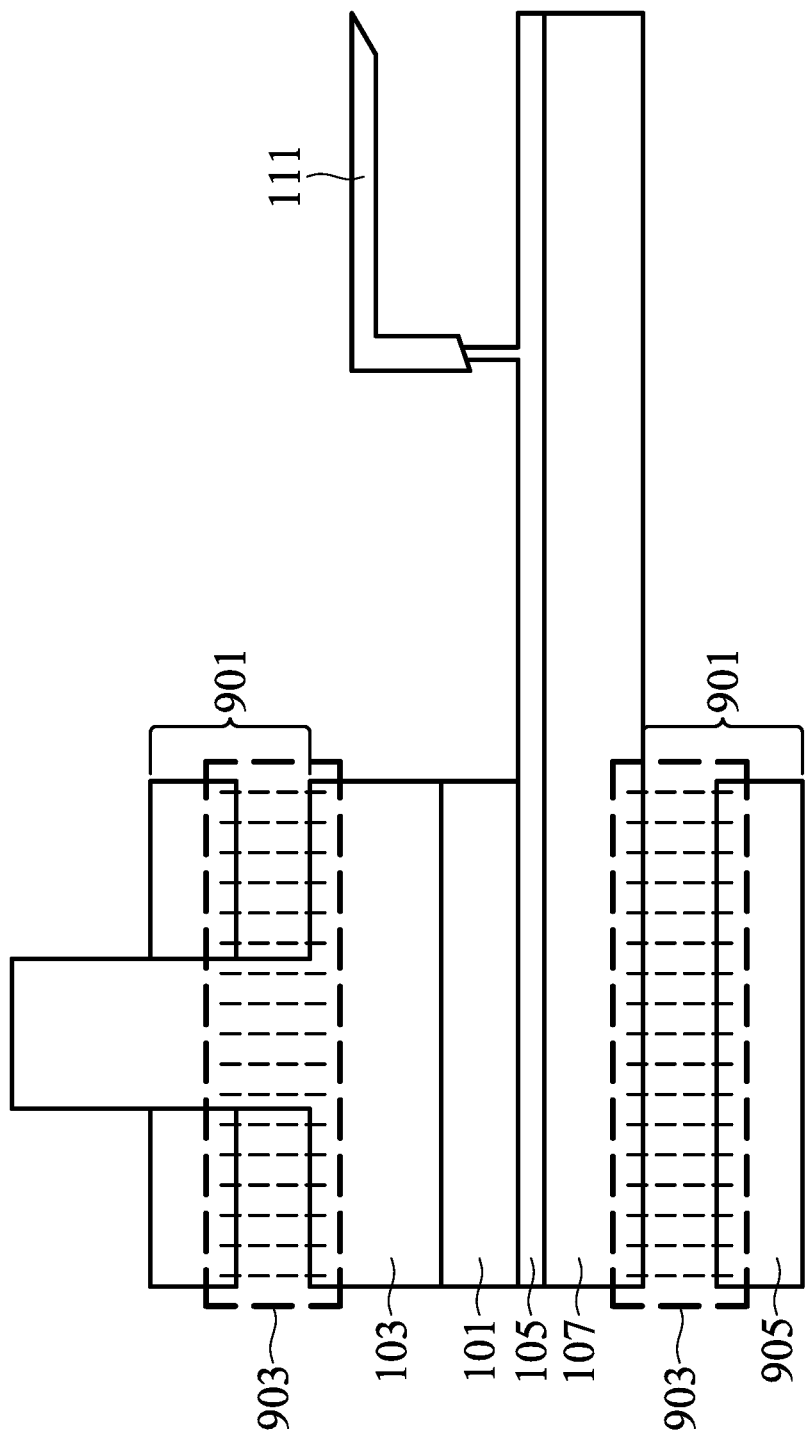

Referring to FIGS. 9A-9B and 10A-10C, in another embodiment, the magnetic system 901 may comprise a series of tracks 903 (for example, numbering eight tracks), each track 903 extending in a radial direction. The tracks 903 may be equidistant (i.e., equiangular) from one another, and each track 903 may be about 150 mm to about 160 mm in length corresponding to a 300 mm wafer 101, for example. Similar to the first embodiment, although the magnetic system 901 and tracks 903 are illustrated in FIG. 9A to extend across the entire diameter of the polishing pad 107, the magnetic system 901 (or the magnetic components of the magnetic system 901) may be any other size, such as smaller or larger in diameter, and the magnet or resulting magnetic field may be aligned specifically with the diameter of the wafer 101 (as depicted in FIG. 9B) as opposed to the entirety of the polishing pad 107. As such, the center of the magnetic system 901, such as where the tracks 903 would converge, may be generally aligned with the center of the wafer 101 or offset by about 10 μm or to about 10 mm.

One or more magnetic balls 1001 (shown in FIGS. 10A-10C) may be disposed on the tracks 903. The magnetic balls 1001 may be permanent magnets or strongly paramagnetic materials (e.g., ferromagnetic materials). Although the components are referred to herein as "magnetic balls" 1001, it should be appreciated that the magnetic balls 1001 need not be in the shape of balls or even resemble balls. In fact, the magnetic balls 1001 may be magnetic or paramagnetic components of any shape that are configured to slide or move along the tracks 903. In addition, the magnetic balls 1001 and tracks 903 may comprise or be associated with robotic elements (not shown in the figures) that are configured to slide or move the magnetic balls 1001 along the tracks 903. Further, although not specifically depicted in the figures, the tracks 903 may form other patterns, such as a polygonal shape, curved lines, concentric circles, or an orthogonal grid.

Similar to the previously described magnetic systems (e.g., 203, 601A, 601B, 701, or 703), the magnetic system 901 may include an electromagnet 905 having coils attached to a high voltage source (not shown in detail). As such, the electromagnet 905 may serve to generate a large magnetic field to attract the magnetizable abrasives 201 toward the wafer 101 or toward the polishing pad 107, while the magnetic balls 1001 generate smaller magnetic fields to more precisely attract the magnetizable abrasives to more specific locations or patterns with respect to a plan view of the wafer 101. Alternatively, if the magnetic balls 1001 are capable of generating strong enough magnetic fields, then the magnetic system 901 need not include the electromagnet 905. The more specific locations or patterns of the magnetic balls 1001 are discussed in greater detail in connection with FIGS. 10A-10C below.

Figure 10A:
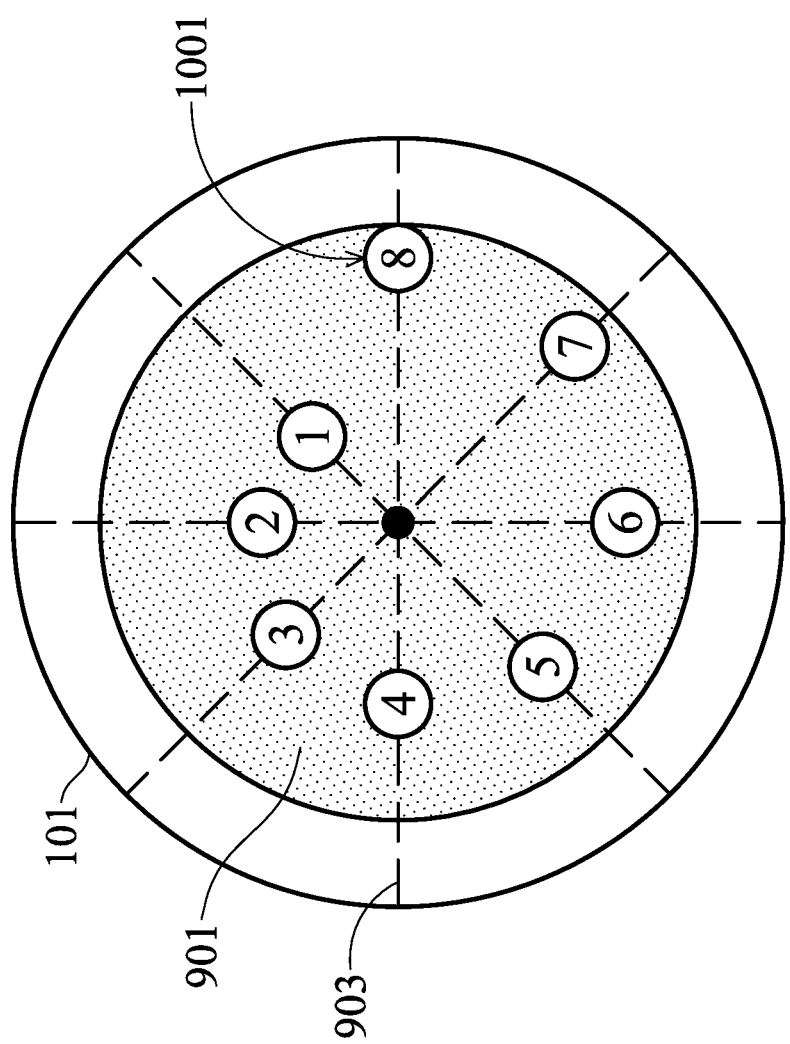
FIGS. 10A-10C are top-down schematic views of various arrangements of the magnetic balls in the third magnetic system.
Figure 10B:
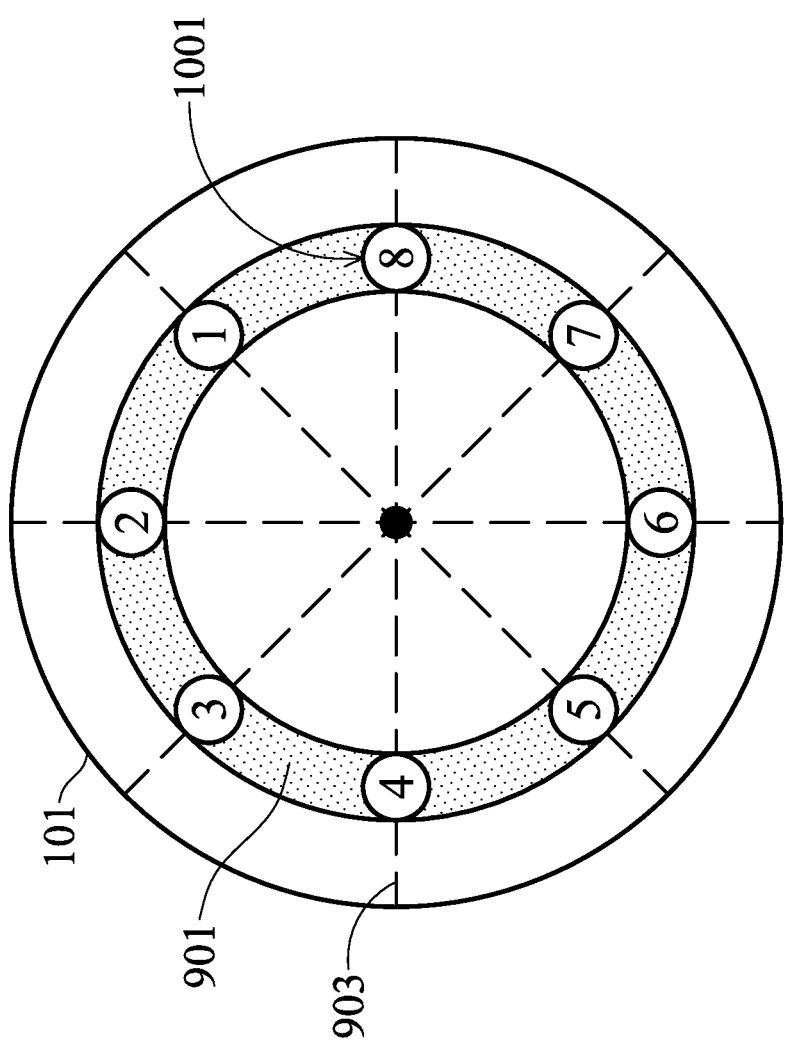
Figure 10C:
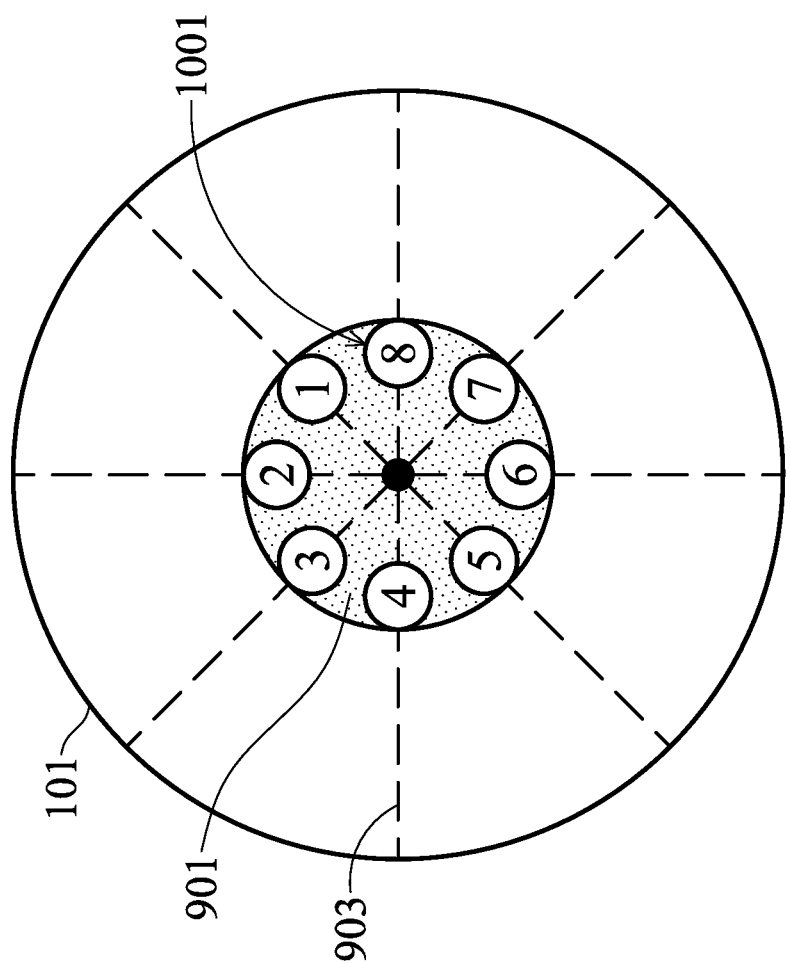

As shown in FIGS. 10A-10C, the movable magnetic balls 1001 may be disposed along the tracks 903. FIG. 10A depicts an orientation in which the magnetic balls 1001 are located at varying radial distances from the center of the magnetic system 901 to form an overall spiral pattern. This orientation would tend to provide a uniform distribution of the magnetizable abrasives 201 within the slurry 105 or, specifically, within the portion of the slurry 105 directly below the tracks 903.

FIG. 10B depicts an orientation in which the magnetic balls 1001 are located on their corresponding tracks 903 far from the center (or near the outer edge of the wafer 101 or the polishing pad 107 as the case may be) to form a large circular pattern. This orientation would tend to distribute the magnetizable abrasives 201 toward an outer portion of the slurry 105 or, specifically, toward an outer portion of the slurry 105 directly below the tracks 903.

FIG. 10C depicts an orientation in which the magnetic balls 1001 are located on their corresponding tracks 903 near the center (or near the center of the wafer 101) to form a small circular pattern. This orientation would tend to distribute the magnetizable abrasives 201 toward the center of the slurry 105 or, specifically, toward a center portion of the slurry 105 directly below the tracks 903. Although not specifically depicted, it should be appreciated that the magnetic balls 1001 may be arranged in other patterns in order to attract the magnetizable abrasives 201 into varying arrangements for better control of the polishing of the wafer 101.

Further, the magnetic system 901 may be configured such that the magnetic balls 1001, the electromagnet 905, or the entire magnetic system 901 can be moved away from the wafer 101 or the polishing pad 107 in order to reduce, remove, or effectively turn off the magnetic field. For example, a portion of the magnetic system 901 (or corresponding magnetic balls 1001) above the wafer 101 and head 103 may be moved upward and away from the CMP system. Alternatively, the magnetic balls 1001 may be removed entirely from the magnetic system 901 and the electromagnet 905 turned off. It should be noted that the magnetic balls 1001 may be moved before, during, or after polishing into various patterns, discussed specifically above or otherwise, in order to achieve the desired effects on the magnetizable abrasives 201.

Furthermore, the CMP system may comprise the magnetic system 901 as well as the second magnetic system 601B as discussed in detail above. In other words, the magnetic system 203, the first magnetic system 601A, and the magnetic system 901 each serves a similar purpose. That is, each may be designed to attract the magnetizable abrasives 201 toward the wafer 101 within the slurry 105 during polishing. To the extent any of the magnetic systems (e.g., 203, 601A, 703, or 901) include a portion below the polishing pad 107, that portion of the magnetic system may be used to attract the magnetizable abrasives 201 toward the polishing pad 107 and, therefore, away from the wafer 101.

Figure 11:
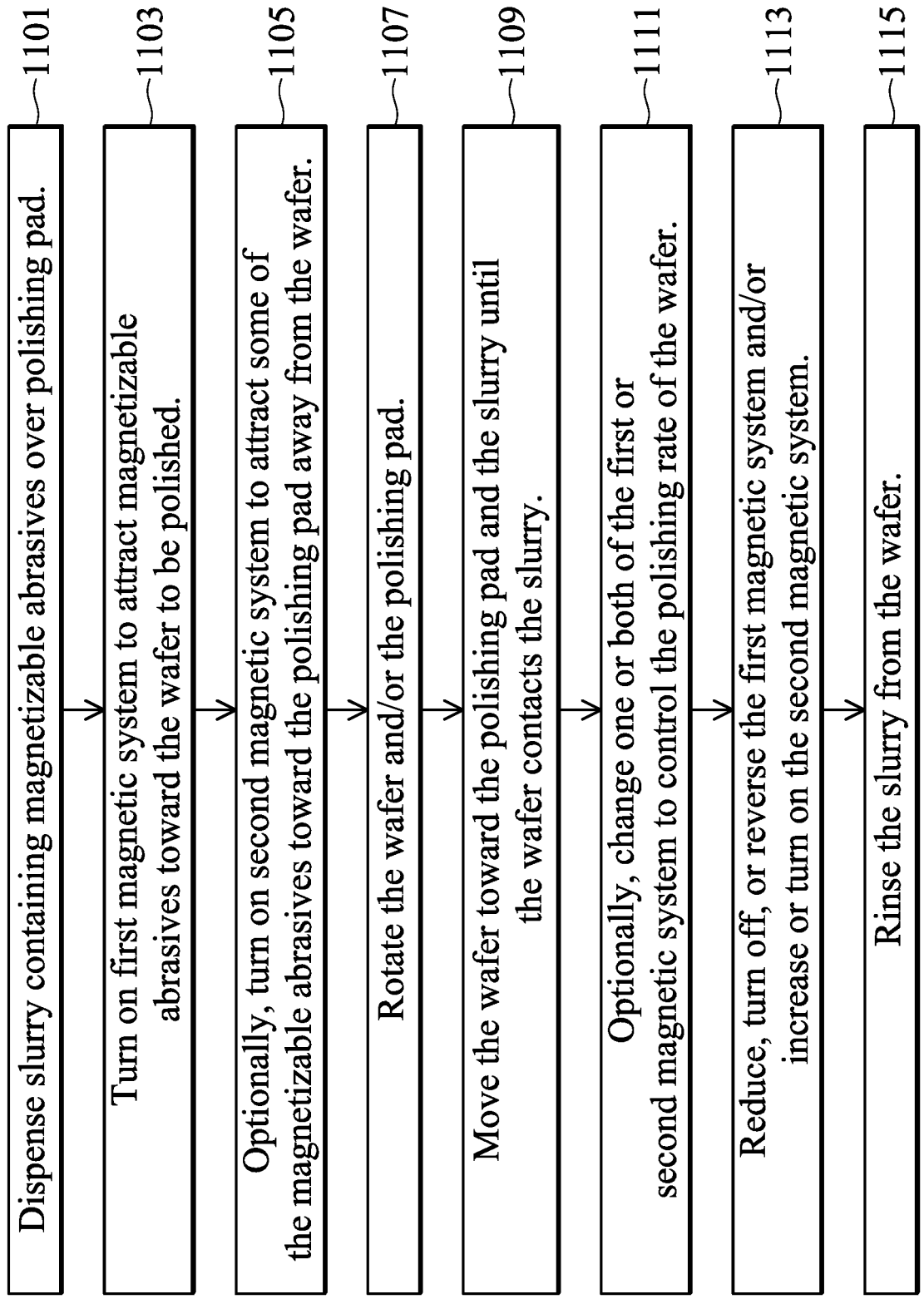
FIG. 11 is a flow chart of a method of chemical-mechanical polishing a wafer with an applied magnetic field.

Referring to FIG. 11, as provided in step 1101, in the application of each of the embodiments, the magnetic system(s) (e.g., 203, 601A, 601B, 701, 703, or 901) may or may not be activated when the slurry 105 is initially dispensed from the dispenser 111 onto the polishing pad 107. Also in step 1101, the magnetizable abrasives 201 may be dispensed with the slurry 105 or added to the mixture afterward. In step 1103, shortly before, after, or while the slurry 105 and/or magnetizable abrasives 201 have been dispensed, the magnetic system(s) may be turned on in order to attract the magnetizable abrasives 201 toward the wafer 101. Optionally, in step 1105, a second magnetic system 601B and/or additional magnetic systems 701 may be turned on in order to control the amount of magnetizable abrasives 201 that continue in-cycle to reach the wafer 101.

In step 1107, around the same time as application of any of those magnetic systems or shortly thereafter, the wafer 101 and/or the polishing pad 107 may be rotated. In step 1109, to polish the wafer 101, the head 103 brings the wafer 101 downward until a broad surface of the wafer 101 makes contact with the slurry 105 including the magnetizable abrasives 201. Note that step 1109 may occur before step 1107.

Optionally, in step 1111, during polishing, any of the magnetic systems may be increased, decreased, turned on, and turned off in order to regulate the rate of polishing. For example, if polishing needs to be slowed down, the second magnetic system 601B may be turned on or increased in order to attract more magnetizable abrasives 201 toward that region of the polishing pad 107 and away from the wafer 101. The fewer magnetizable abrasives 201 near the wafer 101 will contribute to decreasing the polishing rate. Further, any of these methods of controlling the magnetic systems may be performed in conjunction with varying the rotational speeds of the wafer 101 and/or polishing pad 107, the amount of slurry 105 being dispensed, and the distance the broad surface of the wafer 101 is maintained from the polishing pad 107.

In step 1113, the magnetic field(s) of the magnetic system(s) (e.g., 203, 601A, 703, or 901) may be reduced, turned off, or reversed in order to attract the magnetizable abrasives 201 toward the polishing pad 107 or allow the magnetizable abrasives 201 to no longer be drawn toward the wafer 101. In addition or alternatively, the magnetic field 801 of the second magnetic system 601B and/or additional magnetic systems 701 may be turned on or increased in order to attract the magnetizable abrasives 201 toward the polishing pad 107 and away from the wafer 101. In step 1115, at this point, the slurry 105 and the magnetizable abrasives 201 will be more easily rinsed and removed from the wafer 101. The wafer 101 and/or the polishing pad 107 rotations may be stopped around this time. Utilizing one or more of the magnetic systems (e.g., 601B or 701) may allow for separation of the magnetizable abrasives 201 from the slurry 105 to facilitate cleaning and disposal of the slurry 105 and reuse of the magnetizable abrasives 201. The various ways of controlling the distribution of the magnetizable abrasives 201 in the slurry 105 may also facilitate cleaning of the polishing pad 107.

As alluded to above, in each of the embodiments the wafer 101 or the polishing pad 107 or both will rotate during polishing. The magnetic systems (e.g., 203, 601A, 601B, 701, 703, or 901) typically will not rotate with the wafer 101 or the polishing pad 107. However, in some embodiments the magnetic system(s), or a portion thereof including the electromagnet and/or permanent magnet, may rotate with, counter to, or at different speeds than the wafer 101 or polishing pad 107.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In accordance with an embodiment, a CMP system includes a head, a polishing pad, a first magnetic system configured to produce a first magnetic field to a slurry disposed over the polishing pad. The slurry may include magnetizable abrasives with an absolute magnetic susceptibility greater than or substantially equal to $5 \times 10^{-6}$ cm$^3$/mol. The first magnetic field may be oriented to attract the magnetizable abrasives in the slurry toward a wafer to be polished by CMP. In addition, the first magnetic system may be further configured to produce a second magnetic field over the polishing pad to attract the magnetizable abrasives in the slurry toward the polishing pad or away from the wafer. In addition or alternatively, the CMP system may include a second magnetic system below the polishing pad and laterally displaced from a location directly below the wafer, wherein the second magnetic system is configured to produce a third magnetic field over the polishing pad to attract some of the magnetizable abrasives in the slurry toward that portion of the polishing pad laterally displaced from the location directly below the wafer.

In accordance with another embodiment, a CMP system includes a magnetic system, which includes a plurality of tracks extending radially outward from a center region to an edge region and a plurality of magnets, each of which is movable and located along one of the tracks.

In accordance with yet another embodiment, a method of polishing a wafer using CMP includes dispensing slurry having magnetizable abrasives over a polishing pad. The method further includes placing a wafer over and contacting the slurry, and producing a first magnetic field, such that the first magnetic field forces the magnetizable abrasives toward the wafer. The method further includes polishing the wafer with the slurry by rotating the wafer or the polishing pad or both.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A chemical-mechanical polishing (CMP) system, comprising:
   a head;
   a polishing pad;
   a first magnet disposed over the polishing pad, the first magnet configured to apply a first magnetic field to a slurry disposed over the polishing pad, and the slurry comprising magnetizable abrasives;
   a second magnet disposed below the polishing pad, the second magnet being directly below the head; and
   a third magnet disposed below the polishing pad, the third magnet being laterally displaced from the second magnet and the head.

2. The CMP system of claim 1, wherein the magnetizable abrasives are a material selected from the group consisting of titanium (III) oxide, cerium (IV) oxide, titanium dioxide, zirconium dioxide, aluminum oxide, silicon dioxide, or any combination thereof.

3. The CMP system of claim 1, wherein all of the magnetizable abrasives are either paramagnetic or diamagnetic.

4. The CMP system of claim 1, wherein the head is disposed above the polishing pad, the head configured to hold a wafer such that the wafer is interposed between the head and the slurry, the magnetizable abrasives having an absolute magnetic susceptibility greater than or substantially equal to $5 \times 10^{-6}$; and
   wherein the first magnetic field forces the magnetizable abrasives toward the wafer.

5. The CMP system of claim 4, wherein the CMP system is configured to produce the first magnetic field simultaneously with a rotating of the wafer or the polishing pad or both.

6. The CMP system of claim 4, wherein the second magnet is configured to produce a second magnetic field over the polishing pad, and wherein the second magnetic field forces the magnetizable abrasives away from the wafer.

7. The CMP system of claim 1, wherein the second magnet comprises a permanent magnet.

8. The CMP system of claim 1, wherein the second magnet comprises a material selected from the group consisting of neodymium, cobalt, nickel, or combination thereof.

9. The CMP system of claim 7, wherein the permanent magnet is movably disposed along a track.

10. The CMP system of claim 7, wherein the permanent magnet is shaped like a spiral, concentric circles, a polygon, or a curved rod.

11. A chemical-mechanical polishing (CMP) system, comprising:
    a magnetic system comprising:
       a plurality of tracks forming a pattern, each of the plurality of tracks extending radially outward from a center region of the pattern to an edge region of the pattern; and
       a plurality of magnets, each magnet being disposed movably along a respective one of the plurality of tracks.

12. The CMP system of claim 11, wherein the plurality of magnets forms a spiral pattern.

13. The CMP system of claim 11, wherein each of the plurality of magnets is disposed more proximate to the center region than to the edge region.

14. The CMP system of claim 11, wherein each of the plurality of magnets is disposed more proximate to the edge region than to the center region.

15. The CMP system of claim 11, wherein the magnetic system is configured to adjust a location of at least one of the plurality of magnets during a polishing step.

16. The system of claim 11 further comprising an electromagnet disposed above the magnetic system.

17. A chemical-mechanical polishing (CMP) system, comprising:
    a first magnetic system, the first magnetic system comprising:
       a plurality of tracks; and
       a plurality of magnets, each of the plurality of magnets attached along one of the plurality of tracks, each of the plurality of magnets being configured to move along a corresponding one of the plurality of tracks;
    a polishing head disposed over the first magnetic system, the polishing head configured to hold a wafer; and
    a polishing pad disposed over the first magnetic system and below the polishing head, movement of each of the plurality of magnets being in relation to the polishing pad, the movement being directly below and parallel to a flat surface of the polishing pad.

18. The system of claim 17, wherein the plurality of tracks is contained within a circular shape, and wherein each of the plurality of tracks extends in a radial direction within the circular shape.

19. The system of claim 17, wherein the plurality of magnets is configured to form a plurality of shapes.

20. The system of claim 19, wherein the plurality of shapes comprises a small circle, a large circle, and a spiral.

* * * * *